US008552901B2

(12) United States Patent
Danesh et al.

(10) Patent No.: US 8,552,901 B2
(45) Date of Patent: Oct. 8, 2013

(54) COMPOSITE ANALOG-TO-DIGITAL CONVERTER

(75) Inventors: Seyed A A Danesh, Edinburgh (GB); Jonathan Ephraim David Hurwitz, Edinburgh (GB)

(73) Assignee: Broadcom Corporation, Irvine, CA (US)

( * ) Notice: Subject to any disclaimer, the term of this patent is extended or adjusted under 35 U.S.C. 154(b) by 76 days.

(21) Appl. No.: 13/214,788

(22) Filed: Aug. 22, 2011

(65) Prior Publication Data

US 2012/0050082 A1    Mar. 1, 2012

(30) Foreign Application Priority Data

Aug. 31, 2010 (GB) .................................. 1014418.6

(51) Int. Cl.
*H03M 1/56* (2006.01)
(52) U.S. Cl.
USPC .......................................... 341/169; 341/155
(58) Field of Classification Search
USPC .......................................... 341/169, 155, 122
See application file for complete search history.

(56) References Cited

U.S. PATENT DOCUMENTS

| | | | | |
|---|---|---|---|---|
| 6,225,937 B1 * | 5/2001 | Butler | ........................... | 341/169 |
| 7,075,470 B2 * | 7/2006 | Lee | ............................... | 341/155 |
| 7,554,478 B2 * | 6/2009 | Lim | ............................... | 341/169 |
| 7,609,756 B2 * | 10/2009 | Wood | ........................... | 341/155 |
| 7,924,207 B2 * | 4/2011 | Snoeij et al. | ................... | 341/169 |
| 8,253,616 B2 * | 8/2012 | Bogaerts | ....................... | 341/169 |
| 2008/0192127 A1 | 8/2008 | Sakai | | |

FOREIGN PATENT DOCUMENTS

| | | |
|---|---|---|
| GB | 2 175 762 A | 12/1986 |
| WO | 2008/026129 A2 | 3/2008 |

OTHER PUBLICATIONS

European Patent Office, European Search Report; EP Application No. 11007046.3; Oct. 24, 2012; 3 pgs.

* cited by examiner

*Primary Examiner* — Peguy Jean Pierre
(74) *Attorney, Agent, or Firm* — Garlick & Markison; Bruce E. Garlick

(57) ABSTRACT

An analog-to-digital converter (ADC) includes a plurality of single slope ADCs, a ramp generator, and digital output circuitry. Each single slope ADC includes an analog input operable to receive an analog input signal, a ramp input operable to receive an analog ramp signal, a comparator operable to compare the analog input signal to the analog ramp signal, and an output operable to produce a digital representation of the analog input signal based upon the comparison, wherein the plurality of single slope ADCs are operable to receive analog ramp signals that are out of phase with each other. The ramp generator that is operable to generate analog ramp signals for each of the plurality of single slope ADCs. The digital output circuitry is operable to receive outputs from each of the plurality of single slope ADCs and to produce a digital representation of the analog input signal based thereupon.

23 Claims, 12 Drawing Sheets

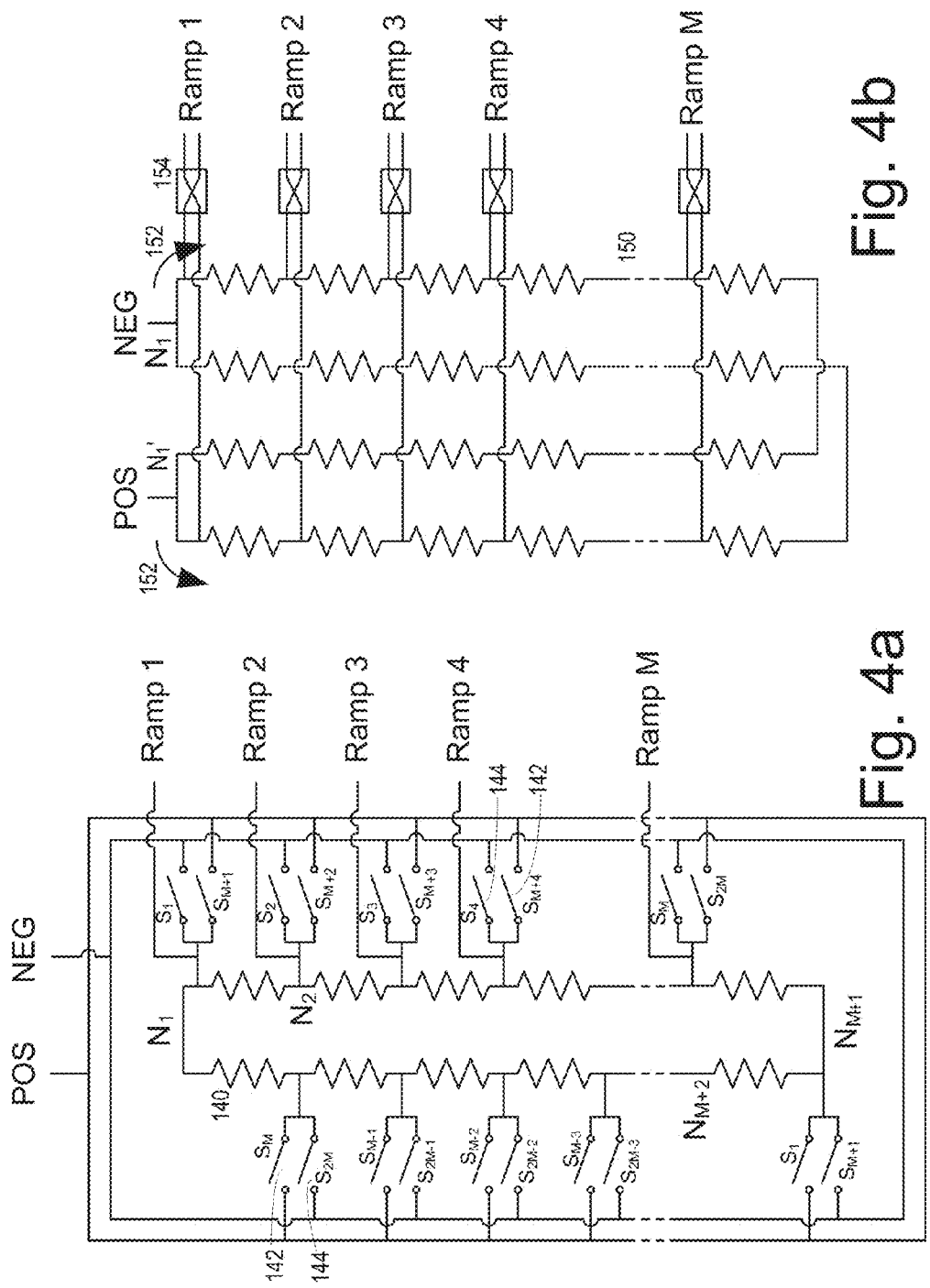

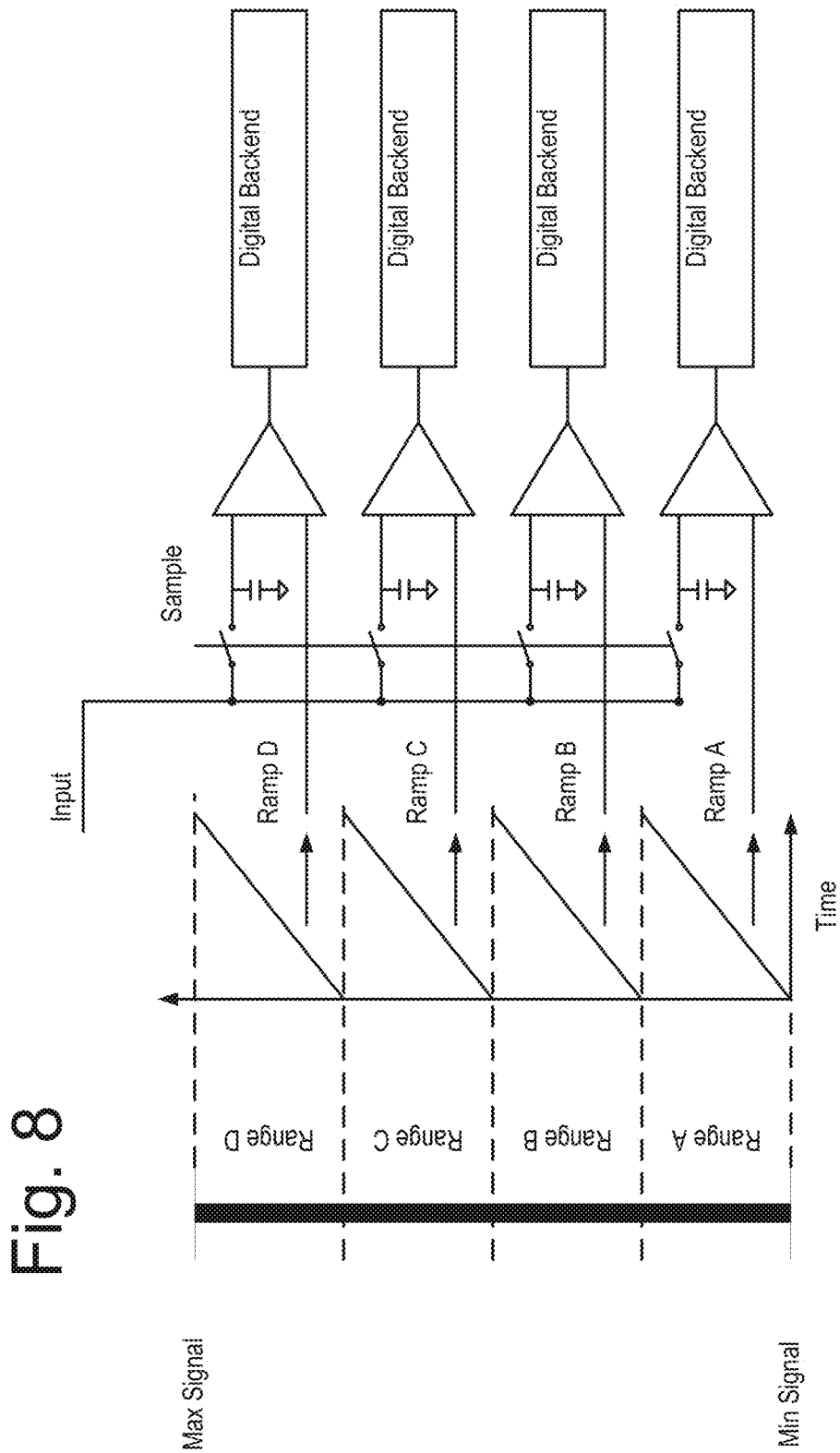

COMPOSITE ANALOG-TO-DIGITAL CONVERTER

CROSS-REFERENCE TO PRIORITY APPLICATION

This application claims priority under 35 U.S.C. §119(a) to Great Britain Application Serial No. 1014418.6 filed Aug. 31, 2010, which is incorporated herein by reference in its entirety for all purposes.

FIELD OF THE INVENTION

The present invention relates to analog-to-digital conversion devices and methods of analog-to-digital conversion, in particular but not exclusively for use in moderately high-speed applications such as in communications devices.

BACKGROUND TO THE INVENTION

Flash analog-to-digital converters (ADCs) achieve the highest conversion rates because an input voltage is compared with all quantization levels in parallel. However, the resolution of flash ADCs is limited by circuit area and input capacitance because of the exponential relationship to the number of comparators required. More recently, time interleaving of multiple ADCs has been applied to address these limitations. According to one approach, several high-resolution, lower speed ADCs are operated together in a time interleaved fashion to provide a high speed, high resolution ADC. Such ADC structure, however, introduces sampling noise and, because of inconsistent sampling interval timing may introduce intermittent and semi-random noise into the sampling process.

BRIEF DESCRIPTION OF DRAWINGS

Further features and advantages of the present invention will become apparent from the following specific description, which is given by way of example only and with reference to the accompanying drawings, in which:

FIG. 4A is a circuit diagram of a first embodiment ramp generator forming part of the circuit of FIG. 2;

FIG. 4B is a circuit diagram of a second embodiment of a ramp generator forming part of the circuit of FIG. 2;

FIGS. 5a and 5b are circuit diagrams of two variations on a fully differential sample and hold and comparison circuit, while

FIG. 8 is a circuit diagram of a section of an analog-to-digital converter featuring sub-ranging of the ramp signal;

DETAILED DESCRIPTION

Figure 1:
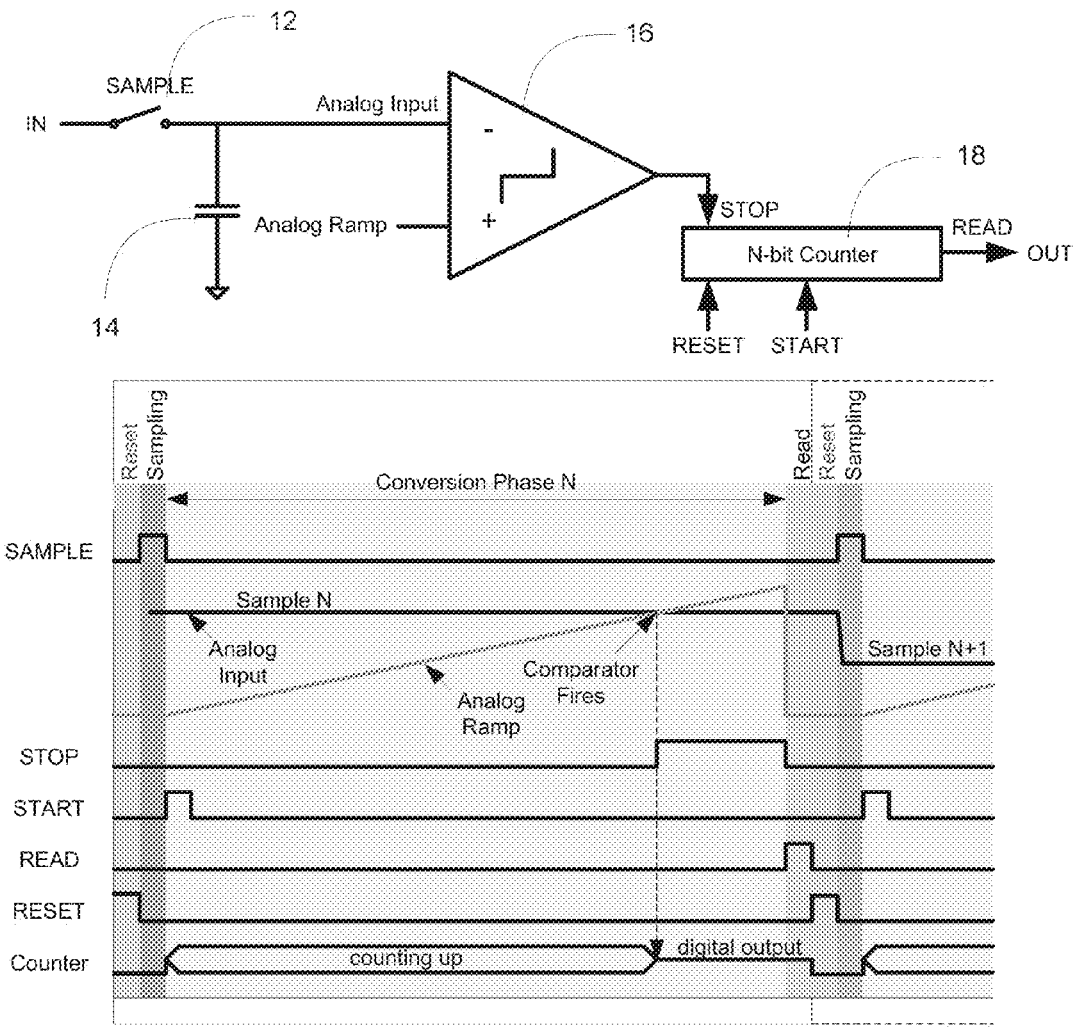
FIG. 1 shows a circuit diagram and a timing diagram for a single slope analog-to-digital converter.

According to a first embodiment of the present invention a composite analog-to-digital converter (hereinafter, ADC or composite ADC) includes a plurality of single slope ADCs, each single slope ADC being operative to receive an analog input signal and an analog ramp signal and to provide a digital representation of the analog input signal in dependence thereon, the single slope ADCs being configured such that an analog input signal received by one of the single slope ADCs is spaced apart in time from an analog input signal received by another single slope ADC and such that the analog ramp signals received by the single slope ADCs are out of phase with each other.

The single slope ADCs may be operable to receive a succession of analog input signals and a succession of time corresponding analog ramp signals, each analog input signal and time corresponding analog ramp signal being spaced apart temporally, each of the analog input signal and corresponding analog ramp signal being received at successive single slope ADCs in a cyclic fashion, such that each single slope ADC provides a digital representation of the analog input signal input thereto using the time corresponding analog ramp signal.

An ADC according to the present invention may include at least four single slope ADCs operable such that, at any one time, a first single slope ADC is in a reset mode, a second single slope ADC may be receiving an analog input signal, a third single slope ADC may be converting an analog input signal to a corresponding digital representation and a fourth single slope ADC may be conveying its digital representation, for example, to processing circuitry.

Alternatively or in addition, the ADC may include at least one ramp generator that is operative to generate an analog ramp signal. The ADC may include a ramp generator for each single slope ADC. The ramp generator may be based in accordance with known practice.

More specifically, the ADC may include solely one ramp generator that is operative to simultaneously generate an analog ramp signal for each of the plurality of single slope ADCs. More specifically, the ramp generator may be operative to provide a plurality of ramp signals, which are all out of phase with each other and with successive ramps signals being out of phase by a clock period. The ramp generator may include any of those described below.

Alternatively or in addition, a single slope ADC may include a sample and hold circuit that is operative to sample an analog input signal and to maintain a voltage of the sampled analog input signal during conversion to a corresponding digital representation. The sample and hold circuit may include a single pole single throw switch in series with a capacitor, the switch being operative to couple the analog input signal to the capacitor for storage thereon.

Alternatively or in addition, a single slope ADC may include a comparator that is operative to receive an analog input signal at one of its inputs, e.g. the inverting input, and an analog ramp signal at another of its inputs, e.g. the non-inverting input. Hence, the comparator may be operative, in accordance with the normal operation of a single slope ADC, to switch its output when the analog ramp signal crosses the analog input signal.

A fully differential configuration may be advantageous depending on the circumstances of application. Hence, a single slope ADC may, alternatively or in addition, include a differential sample and hold circuit configured to sample one end of a differential input signal onto a first input of a comparator, and the other end of the differential input signal onto a second input of the comparator and then to apply two ramp signals of opposite slope such that one is applied to each input, the comparator output being operable to flip when its inputs reach a common level, the time taken to do so being determined by the differential input signal.

Alternatively or in addition, each single slope ADC may include a digital counter, operable to count to a digital value based upon the analog input signal, input thereto.

The ADC may be configurable to increase resolution at the expense of sampling rate or to increase the sampling rate at the expense of resolution by changing the ratio of clock speeds for different parts of the ADC. The different parts of the ADC may include at least the ADC input sample rate and the digital counter clock rate.

Alternatively or in addition, the ADC may further include a digital counter and each of the plurality of single slope ADCs may include a digital memory. The digital counter may be operative to cycle continuously and the ADC may be configured to convey a value from the digital counter to each of the digital memories, the ADC being further operable to read a final value from each digital memory, the final value being dependent upon the analog input signal of the corresponding single slope ADC. The digital memory may include at least one of SRAM and DRAM.

The ADC may be configured to convert each value conveyed from the digital counter to a coded value according to a code in which two successive values differ in respect of only one bit, such as Gray code.

A method of operating an ADC according to one or more embodiments of the present invention includes receiving an analog input signal and an analog ramp signal at each of a plurality of single slope ADCs and operating each of the single slope ADCs to provide a digital representation of the analog input signal in dependence on the analog input signal and the analog ramp signal, an analog input signal received by one of the single slope ADCs being spaced apart in time from an analog input signal received by another single slope ADC and the analog ramp signals received by the single slope ADCs being out of phase with each other. An output of the ADC is created based upon the output of the single slope ADCs.

A ramp generator constructed according to one or more embodiments of the present invention may include a plurality or resistive elements arranged in series so as to form a ring, a switch network, first and second power supplies, each at a different level, and a controller arranged to control the switch network. This structure connects a first power supply successively to each node of the resistor ring while also connecting a second power supply to a node diametrically opposite the node to which the first power supply is connected, such that the first and second supplies are always connected to diametrically opposed nodes and such that first and second power supply connections effectively rotate around the ring during ramp generation, thereby providing a plurality of ramped outputs, each from a different node of the resistor ring.

The first supply may be a positive supply and the second supply may be a negative supply. In one embodiment, the resistor ring has four times as many resistors as ramp outputs, each ramp output being taken from two diametrically opposed nodes multiplexed together. In such a case, each ramp output may be operable to provide oppositely sloped ramps simultaneously. The resistor ring may be physically arranged such that each of the nodes which are multiplexed together to provide a ramp output are physically located adjacent one another. The ramp generator may include two switches for each of the nodes, so as to enable selective connection of each node to each supply.

FIG. 1 shows a circuit diagram and timing diagram 10 for a known type of single slope analog-to-digital converter (ADC). The single slope ADC includes a sample and hold circuit formed from a switch 12 and a capacitor 14, a comparator 16 and a digital counter 18. As a first step, the digital counter is reset. Then, the switch 12 is closed and opened to thereby sample an analog input signal and hold its voltage level on the capacitor. The sampled voltage level is applied to the inverting input of the comparator 16 whilst an increasing analog ramp signal is applied to the non-inverting input of the comparator. Upon initial application of the ramp signal to the non-inverting input, the digital counter 18 is started. When the analog ramp signal crosses the sampled voltage level, the comparator switches to thereby stop the digital counter. The count held in the counter is then read out, with the count being a digital representation of the sampled voltage.

Figure 2:
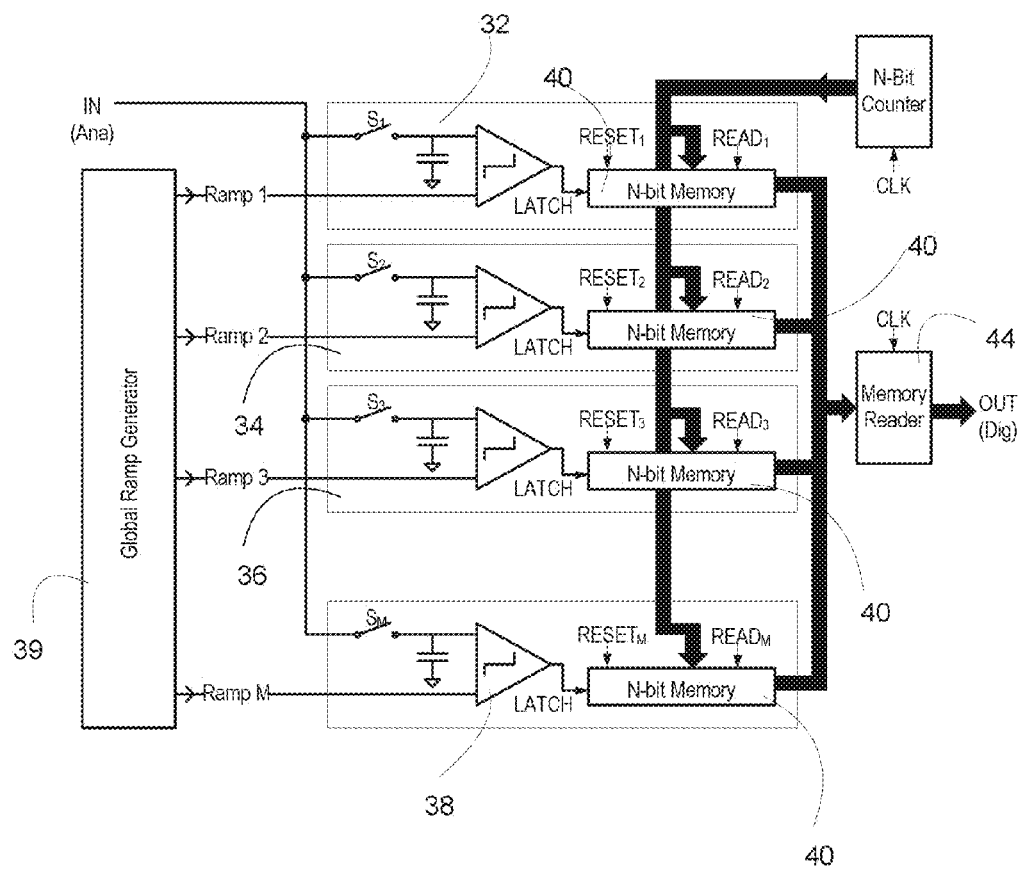
FIG. 2 is a circuit diagram of an analog-to-digital converter according to the present invention.

FIG. 2 shows a circuit diagram of an ADC according to the present invention. The ADC includes M single slope ADCs 32, 34, 36, and 38 in a parallel arrangement, each single slope ADC 32, 34, 36, and 38 forming a row of the ADC. A global ramp generator 39 (such as that described later) provides a plurality of temporally spaced apart ramp signals, each ramp preferably being a single clock cycle out of phase compared to the previous ramp. Of course, it is equally within the scope of the invention to simply provide a plurality of separate ramp generators for each single slope ADC, or some other such combination.

Each single slope ADC may be of the same form and function as the single slope ADC of FIG. 1 except as follows. In each single slope ADC of the circuit of FIG. 2, the digital counter is replaced with a digital memory 40, which receives a count value from a global digital counter 42 as described below in more detail. The ADC of FIG. 2 also includes a memory reader 44 that is operative to read values from each digital memory 40. In an alternative, un-illustrated embodiment, each single slope ADC of the circuit of FIG. 2 includes a digital counter instead of the digital memory and thus corresponds in form and function to the single slope ADC shown in FIG. 1. Generally, the single slope ADCs 32, 34, 36, 38 operate in parallel and out of phase with each other to thereby derive an M-fold increase in conversion throughput.

In use, the ADC of FIG. 2 may be operative such that the first single slope ADC receives a first analog input signal and begins conversion of the first analog input signal into a first digital representation. Then the ADC may be operative such that the second single slope ADC receives a second analog input signal and begins conversion of the second analog input signal into a second digital representation, reception of the second analog input signal taking place a predetermined period of time after reception of the first analog input signal. The first and second analog input signals may be sampled from a same signal source, e.g. signal source in a communications devices or an output from a sensor. Hence, the ADC may be used to achieve a moderately high speed conversion rate that compares, for example, with the slow conversion rate achieved with one single slope ADC or the fast conversion rate achieved with a flash ADC.

The analog ramp signal (i.e. a first ramp signal) received by the first single slope ADC may be in phase with the reception of the first analog input signal. The analog ramp signal (i.e. a second ramp signal) received by the second single slope ADC may be in phase with the reception of the second analog input signal. Hence, the first and second ramp signals may be out of phase with each other by the predetermined period of time between reception of the first and second analog input signals.

More specifically, the ADC may be configured such that each of the single slope ADCs receives a plurality of spaced apart pairs of analog input signals and analog ramp signals. Thus, the first and second single slope ADCs may be operative perform a series of conversions in a reciprocal fashion.

Figure 3:
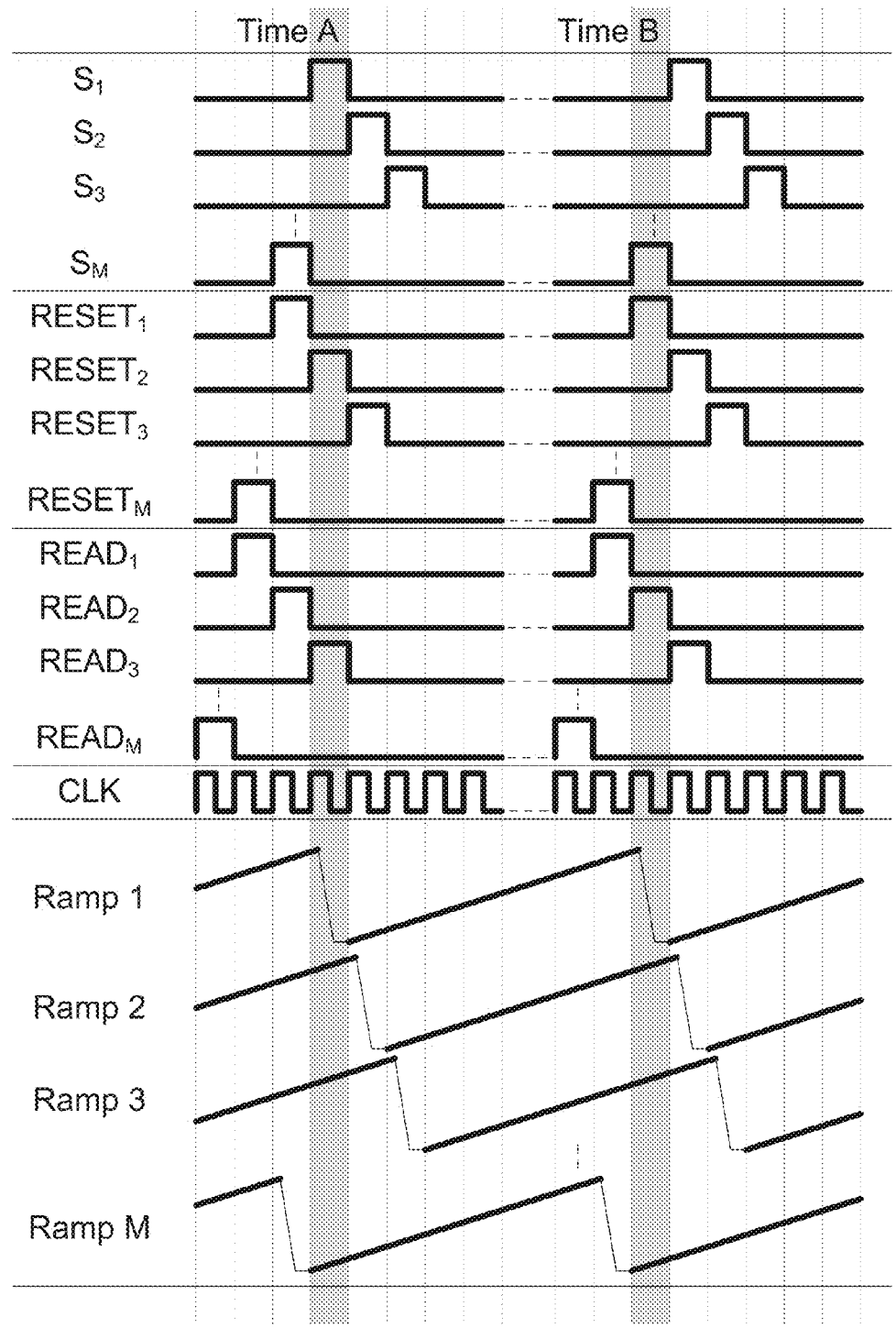
FIG. 3 shows various timing, control, and input signals present during operation of the converter of FIG. 2.

FIG. 3 is a timing diagram of an operational embodiment of the devices of FIG. 2. Two arbitrary time points, A and B, have been highlighted (shaded) and will be discussed by way of example. At time A, The first single slope ADC (row 1) 32 is sampling the input, the second single slope ADC (row 2) 34 is in reset, the third single slope ADC (row 3) 36 is reading out the result of the conversion, and the Mth single slope ADC (row M) 38 has just finished sampling in the previous clock cycle and is now busy converting. At time point B, row 1 32 is in reset, row 2 34 is reading out the value of the conversion, row 3 36 is almost at the end of its conversion period, and row M 38 is sampling the input. Indeed, at any moment in time, one row is in reset, one is sampling the input, one row is reading out, and all other rows are mid conversion. At the next clock cycle the sampling, resetting, and reading move forward to the next rows in a circular way, with row 1 and row M being next to each other in the circle. In this example, each ramp signal, Ramp1 to Ramp M, is out of phase from the preceding ramp signal by one clock cycle.

In the example of FIG. 3, $M=2^N$ since the clock for the N-bit counter, and the Sample/Reset/Read base clocks are the same. Consequently, the number of clock cycles required for conversion, which is $2^N$, should equal the number of rows available in the system for this example. As mentioned before, the N-bit counters at the back of each row have been replaced with an N-bit memory latching from the counter (data) bus. Preferably, the count sequence each row receives should be out of phase by one code from its neighbouring row, since each row is out of phase by one clock cycle from its neighbours in its conversion cycle. Here the count value they each receive is identical to a continuously cycling N-bit counter, meaning that the digital output from each row has a fixed offset equal to its row number. To correct for this, the digital output from row X, where X is the row number between 1 to M, should be subtracted by X. Also, each row has a latency of $2^N$ clock cycles and therefore the total ADC has a $2^N$ clock cycles latency as well.

In the above example, the rotation speed of the ramp-generator, the sampling switch's sampling rate and the digital back-end sampling rate are all equal (that is the counter clock and the sample/reset/read base clocks are the same). However, this does not necessarily need to be the case. In fact, the relative sampling rates of these 3 subsystems can be changed in real-time, effectively building a reconfigurable ADC. It should be appreciated that this reconfiguration can be achieved without physically changing the device, but just by altering these sampling rates relative to each other. For example, if the ADC is configured according to the FIG. 3 example, with all the clocks operating at 1 GHz, and having 128 rows, the ADC operates as a 7-bit, 1 GHz ADC. But, should the ladder be adjusted to work at 500 MHz, and sample at 500 MHz, while the digital back-end is still sampling at 1 GHz, The ADC operates as an 8-bit 500 MHz ADC. It should of course be appreciated that the above FIGs. are provided purely as examples. Consequently, the resolution and sampling rate of the overall converter can be traded off for each other (in real time) by adjusting the relative operation speeds of the different sub-sections.

Implementation of Sub-blocks

Here follows one or more implementations of the sub-blocks and support circuitry necessary for the operation of the ADC of FIG. 2. It should be appreciated that these are shown by way of example only and other suitable alternatives can be envisaged and substituted as appropriate.

Parallel Ramp Generator

As explained above, a total of M different ramps, all out of phase from one another by a single clock period, require to be generated for this system. In parallel counter ADC systems, only one ramp is needed which is usually generated from a Digital to Analog Converter (DAC), either from a resistor string or current source array. Monotonicity of the ramp is of great importance in counter based converters. Implementation of M different current or resistor string DAC blocks is not practically feasible and therefore a novel folded rotating resistor ladder generating M out of phase ramps is proposed.

FIG. 4*a* shows a parallel ramp generator resistor string 140. The resistor string forms a ring, with each node between adjacent resistors being connected to a positive supply rail, in each case via a switch 142 and also to a negative supply rail, in each case via a switch 144, such that each node of the resistor string can either connect to a positive reference voltage (POS) or a negative reference voltage (NEG).

As there are 2M nodes, there are a total of 4M switches 142, 144 that are operated in pairs in accordance with a total of 2M controlling signals $S_1$ to $S_{2M}$. At each clock cycle, only one of these signals is high, and will operate a pair of switches such that one node is connected to POS and the node diametrically opposite this in the ring is connected to NEG. At the next cycle, the pair of switches operated is that which connects the nodes adjacent to those previously connected, the connections remaining diametrically opposite. In this way, each signal $S_1$ to $S_{2M}$ goes high in turn, and as a consequence connection to POS and NEG effectively rotates around the ring, moving a node at a time at each clock cycle. Therefore, if it is assumed that at time=0, signal $S_1$ is high, node $N_1$ on the ladder will be connect to the NEG and node $N_{M+1}$ will be connected to POS. In the following clock cycle signal $S_1$ will go low and signal $S_2$ will go high, and $N_2$ will connect to NEG and node $N_{M+2}$ will connect to POS. As signals $S_1$ to $S_M$ go high in order, the signal at Node $N_1$ will look like a rising (stepped) ramp from NEG to POS, the smoothness of the ramp being dependent on the number of resistors in the string. However, when signals $S_{m+1}$ to $S_{2M}$ go high in order, Node $N_1$ will produce a falling ramp, which is undesirable, as during that period the signal Ramp 1 should ideally be another rising ramp.

FIG. 4*b* shows an extended resistor string 150 which can be used to address the above problem, the resistor string having twice the number of resistors arranged essentially in a ring. However, as a practical measure, the resistor ring is actually realized as a folded figure of 8, as shown in FIG. 4*b*, for reasons explained later. Switches are not shown in this drawing for clarity, but the circuit is switched in a similar way to FIG. 4*a*, such that nodes on the resistor ring diametrically opposite are simultaneously switched to a supply rail, one carrying a positive supply and one carrying a negative supply.

In this case, only one connection is shown to each supply, POS and NEG. As before, this switching is operated such that this connection to POS and NEG effectively rotates around the ring, moving a node at a time at each clock cycle. The direction of this rotation for each supply is shown by the arrows 152.

In the first half of the signal switching sequence ($S_1$ to $S_{2M}$), up to signal $S_M$, signal Ramp 1 is taken from node $N_1$, when signal $S_{m+1}$ goes high and then throughout the second half of the sequence, signal Ramp 1 is then taken from $N_{M+1}$. When signal $S_1$ goes high again, the sequence is repeated. As with the arrangement of FIG. 4a, a complete switching sequence through signals $S_1$ to $S_2M$ results in two ramps on node $N_1$ (similarly on nodes $N_2$-$N_M$, each one clock cycle out of phase from the previous node), one rising and one falling. However, at the same time on node $N_1'$, diametrically opposite $N_1$, two opposite ramps are also being generated, such that when the ramp generated at node $N_1$ is rising, the ramp generated at node $N_1'$ is falling and vice versa. Nodes $N_1$ and $N_1'$ are multiplexed together such that an always rising ramp signal can be obtained, the multiplexer 154 swapping connection between nodes $N_1$ and $N_1'$ as appropriate (by always rising, what is actually obtained is a sawtooth signal comprising two "teeth" or rising ramps for every complete switching sequence through signals $S_1$ to $S_{2M}$). Furthermore, because one node is generating a rising ramp at the same time that its opposite node is generating a falling ramp, it should be appreciated that the multiplexer output can also generate an always falling ramp signal at the same time as the always rising ramp signal. This is put to good use where the comparator is implemented as a fully differential system, and therefore requires corresponding rising and falling ramps, as described below.

As mentioned previously, the resistor ring is actually realised as a folded figure of 8. In using this physical configuration, node $N_1$ and node $N_1'$ are effectively next to each other, as are nodes $N_2$ and $N_2'$ etc. up to $N_M$ and $N_M'$. Having the resistor ring arranged such that corresponding ramp output nodes are close together and on the same row makes the device easier to manufacture on silicon.

Sampling, Ramping and Analog Front End

Figure 5C:
FIG. 5c is a timing diagram for control of the circuits of FIGS. 5a and 5b.
Figure 5A:
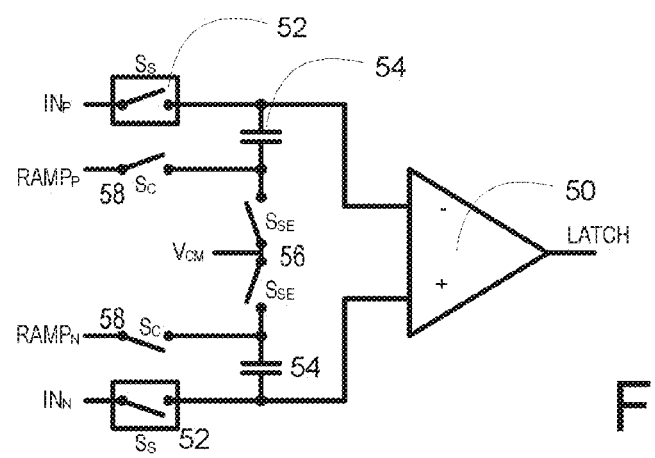
Figure 5B:
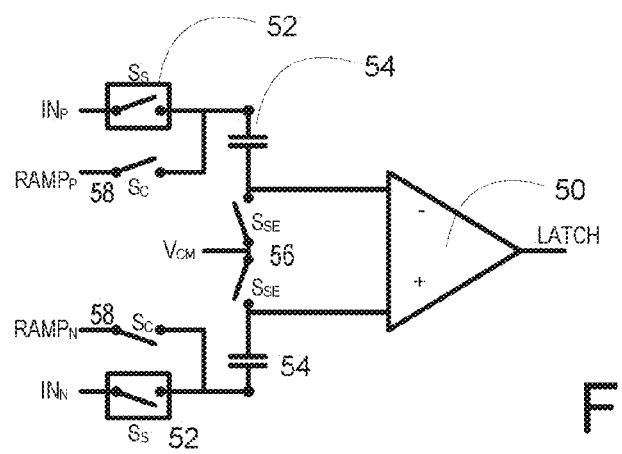

FIG. 5a and FIG. 5b both show two variations on a fully differential system for comparing the ramp and analog input so as to latch the N-bit memory/digital counter. FIG. 5c is a timing diagram applicable for the operation of both variations. FIGS. 5a and 5b show a comparator 50, the output of which latches a digital counter. In this example, a folded cascode amplifier is used for the comparator. Both inputs of the comparator 50 are connected to the differential input signal $IN_P$, $IN_N$ via pair of switches 52 (controlled by signal $S_s$). Two capacitors 54, pairs of switches 56, 58, common-mode voltage $V_{CM}$ and ramp signal inputs $RAMP_P$, $RAMP_N$ are arranged as shown. Switch pair 56 is controlled by signal $S_{SE}$ and switch pair 58 is controlled by signal $S_C$. The control of these switches is shown in the timing diagram of FIG. 5c.

Considering FIG. 5a in particular, this employs a technique known as Bottom Plate Ramping. First of all the differential input is sampled onto two capacitors 54. During the ramping phase, rather than connecting the ramp signals to other inputs of the comparator, they are used to move the bottom plates of the sampling capacitors 54. $RAMP_P$ is a rising ramp from $V_{min}$ to $V_{max}$, and $RAMP_N$ is falling ramp. When ramping in this way the comparator 50 always fires when its inputs are at common-mode. This means at the time of firing the comparator has the same internal DC conditions, and hence the same open loop gain, bandwidth, and delay regardless of the signal magnitude. Using this technique, the delay from the inputs crossing to the output of comparator firing is always a constant value, independent of the signal magnitude. This does result in a constant offset for the entire ADC, but this is easily corrected for in digital. However, the magnitude of leakage on the sampling capacitors is signal dependent since the length of time until firing is signal dependent. This leakage is on both capacitors and hence comes through as common-mode error. Furthermore, some common-mode rejection is required. Therefore, the comparator does not always fire exactly with inputs at common-mode and some care is required to achieve a gain-bandwidth product (GBW) in the comparator to eliminate the signal dependent delay below one least significant bit.

Digital Memory Backend and Readout Circuit

As previously mentioned, the backend counter of the single slope ADC is replaced with a memory unit. The ADC may be configured to convey a value from a cyclically counting common digital counter to each of the digital memories. A value may be conveyed, i.e. read, from the digital counter to a digital memory of a row when the row comparator latches. Hence, values conveyed from the digital counter to respective digital memories may not correspond to absolute digital representations of converted analog input signals. More specifically, a value conveyed from the digital counter to a single slope ADC may be offset from an absolute digital representation of the converted analog input signal by an amount corresponding to the row of the ADC used for that specific conversion. Using an example where there are six rows, an offset amount for the digital counter value for the sixth row may be higher than an offset amount for the digital counter value for the fifth row. Hence, the ADC may subtract the appropriate offset value from the digital counter value for a specific row.

The memory unit can be implemented as an SRAM or DRAM structure. An SRAM approach is larger in each row and requires a tree for readout, while a DRAM solution consumes less space in each row, and requires a sense comparator for read out.

Figure 6:
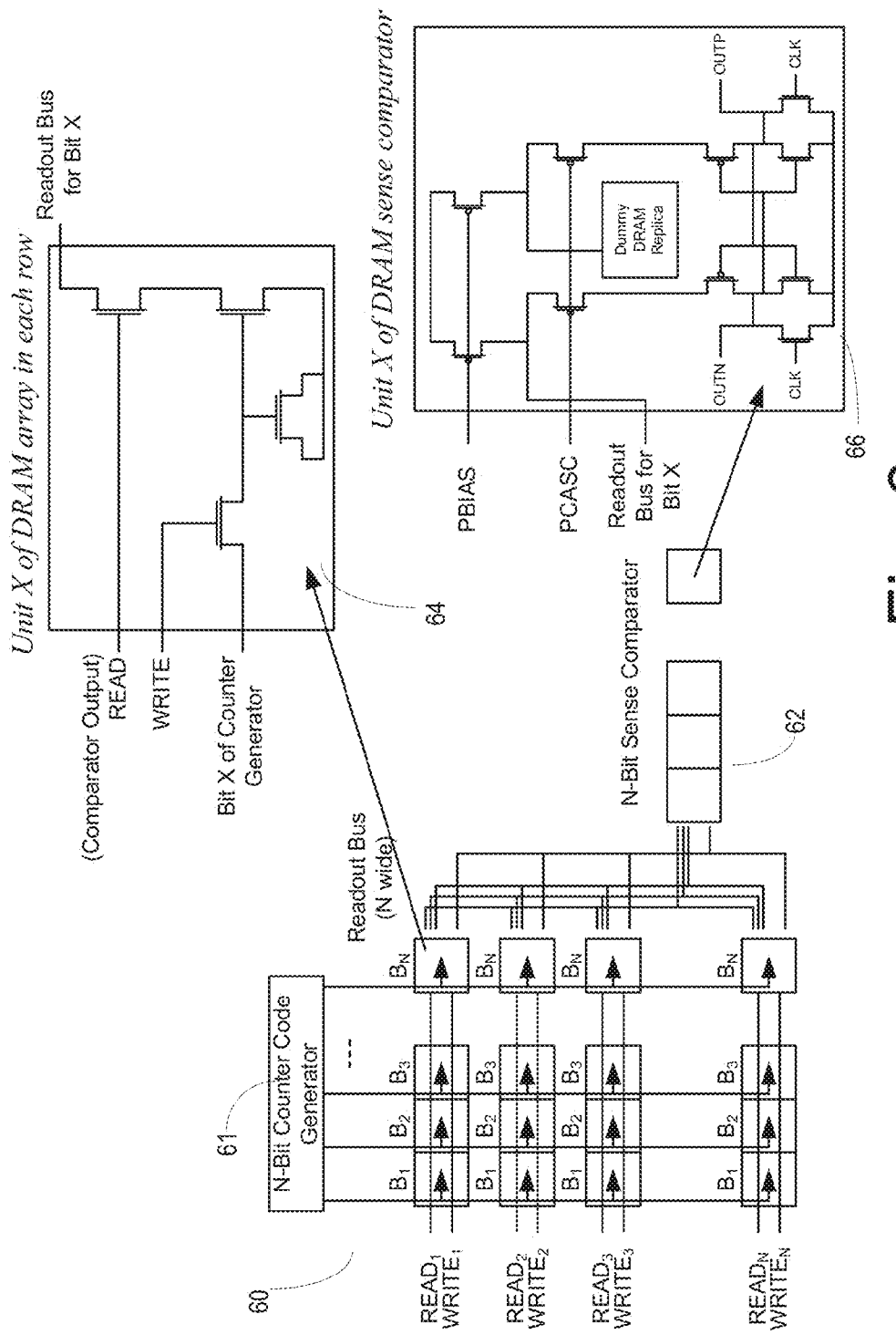
FIG. 6 is a detailed circuit diagram of the digital memory and digital counter of the converter circuit of FIG. 2.

FIG. 6 shows a custom DRAM cell 60 with N-bit counter 61 and a static sense comparator 62, which is used in this embodiment of the ADC. Also shown in detail are a single unit of the DRAM cell array 64 and a single unit of the DRAM sense comparator 66. Due to the high readout bus capacitance, the current from each DRAM unit is folded using a biasing circuit in the sense comparator before being fed to a latch.

Counter Generator and Driver

Switching of comparators in the plurality of single slope ADCs may be asynchronous to the clocking of the digital counter. Hence, there may be a risk that at a time of switching of a comparator the digital counter may be at a transition between first and second successive values with a possible consequence that a first part of the digital memory may receive a part of the first value and a second part of the digital memory may receive a part of the second value. Where binary code is used, a large error may result. Therefore, the ADC of any of the embodiments disclosed herein may additionally convert each value conveyed from the digital counter to a coded value according to a code in which two successive values differ in respect of only one bit, such as Gray code.

Further Embodiments

Figure 7A:
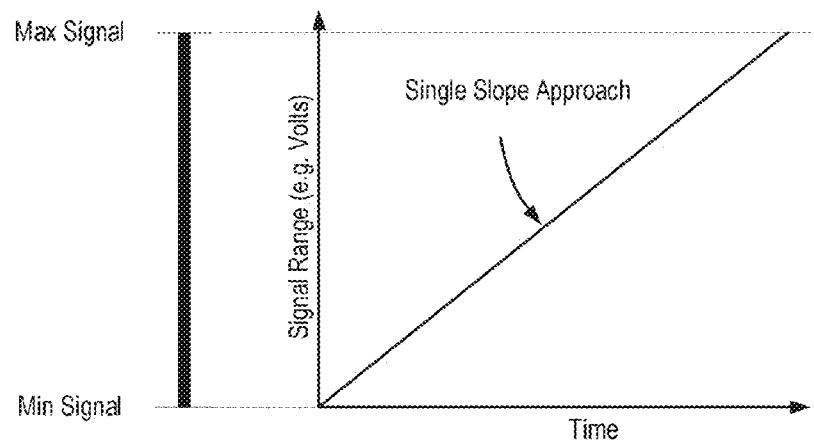
FIG. 7a is a graph of a ramp signal over time for the full input signal range.

One issue with single-slope ADCs, whether used in isolation or in a time-interleaved implementation as described above, is latency. This results from the time taken from sampling the analog signal to the digital signal appearing at the output necessarily being equal to the length of the ramp. To reduce the latency of the system, ideally, one would like to reduce the length of the ramp; however, the length of the ramp is proportional to the full signal range, and therefore each of the ramps fed to each column cover the full signal range. The comparator firing point, that is the point where the ramp voltage matches the sampled input voltage, could be anywhere in that signal range. This is illustrated in FIG. 7a.

Figure 7B:
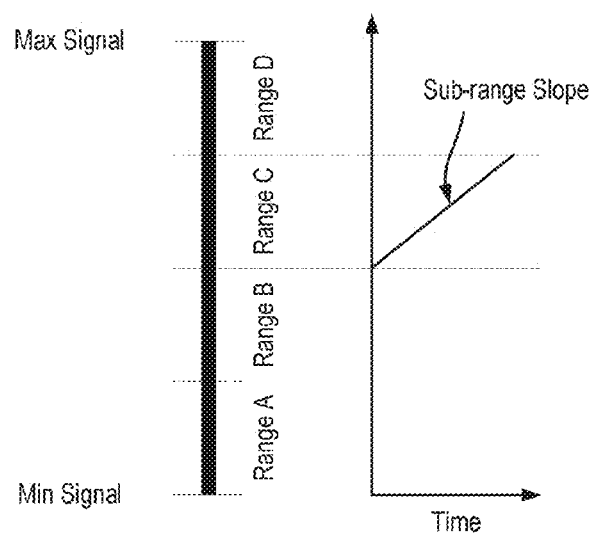
FIG. 7b is a graph of a ramp signal over time for a sub-range of the full input signal range.

To address this issue, it is proposed to use a sub-ranging system, wherein the full signal range is divided into sub-ranges. In the example shown in FIG. 7b, the signal full range is divided into four sub-ranges, ranges A, B, C, and D. Each sub-range represents a quarter of the full signal range. In a sub-ranging ramp based system, if it is chosen to only look (say) at Range C of the full signal range, the ramp required for the row only needs to cover a quarter of the full-range. Since the ramp only covers a sub-section of the full signal range, the total length of time required for the ramp will be reduced. Should the signal not be in Range C, the converter would fail to digitise the input signal.

Sub-ranging is a system-level approach to reduce latency, but can be implemented in many different ways. The following paragraphs will explain three different implementations to achieve sub-ranging.

Sub-ranging Using Parallelism

As described above, in sub-ranging systems, the full input range is divided into sub-ranges, and the input is compared within this sub-range. In a parallel sub-ranging scheme for the time-interleaved counter ADC proposed, the signal range is divided into sub-ranges, and the input is sampled multiple times simultaneously, the amount of times being equal to the number of sub-ranges. A sub-ranging ramp is fed to each sampling and comparator sub-system, and many conversions of the same signal are done in parallel.

FIG. 8 shows a sub-ranging sub-system for a single counter based ADC. Again, the input range is divided into 4 sub-ranges, although the skilled person will recognise this is only an example, and the range can be divided into many more or less sub-ranges. Note that the example shown in FIG. 8 is a simple sub-ranging system shown by way of example, and does not include time-interleaving.

In this example, a total of four channels are used to achieve a parallel sub-ranging system of four ranges. The input is sampled on to the four channels simultaneously. Four different ramps that are in phase with each other, but cover different sections of the input signal range, begin ramping and are fed to the different rows. Each row independently compares the sampled input signal against the ramp it receives, which covers a sub-range of the signal full range. Since the input signal can only be in one of the signal ranges, only one of the rows will ever fire. This shows which range the signal is in (A, B, C or D). The digital counter value stored in the digital backend for the firing comparator represents the exact point within that range which the signal is in, and hence the digital value equivalent to the input signal can be determined.

It is now proposed to combine the above implementation of a parallel sub-ranging system with the time-interleaved implementation previously explained, so as to obtain a time-interleaved sub-ranging counter ADC. In the basic time-interleaving system, the latency was proportional to resolution (the steps required in the backend counter and ramp). In the proposed combined system, the comparators are paired up to build sub-ranging sub-systems. Therefore, for a given number of comparators, the latency is reduced, at the cost of a reduction in the effective sampling rate of the overall converter, since more than one row now deals with only one input signal.

Referring back to FIGS. 4a and 4b, and to FIG. 8, it can be appreciated that ramps A, B, C and D (while not spatially next to each other) are already produced by the ramp-generator described in FIG. 4.

Figure 9A:
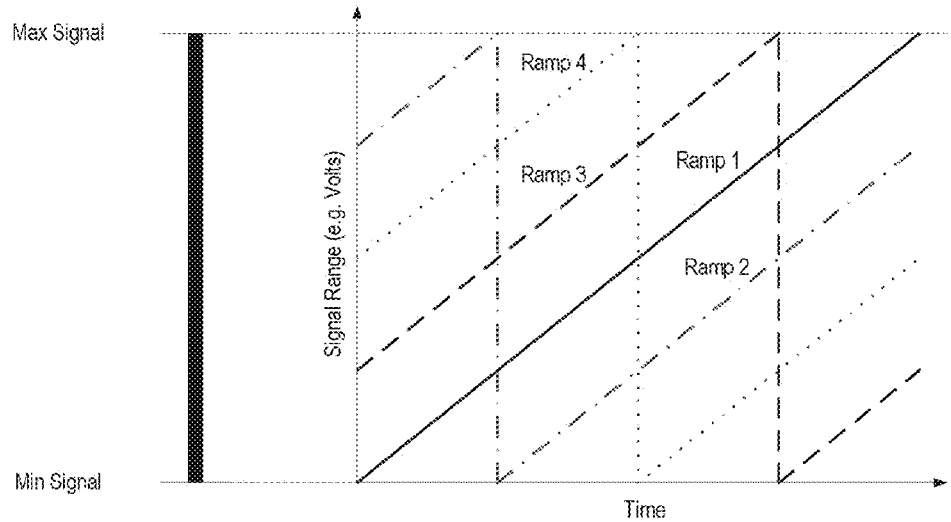
FIG. 9a is a graph showing four ramp signals for the basic time-interleaved system of FIG. 2, each out of phase from one another by 90 degrees.
Figure 9B:
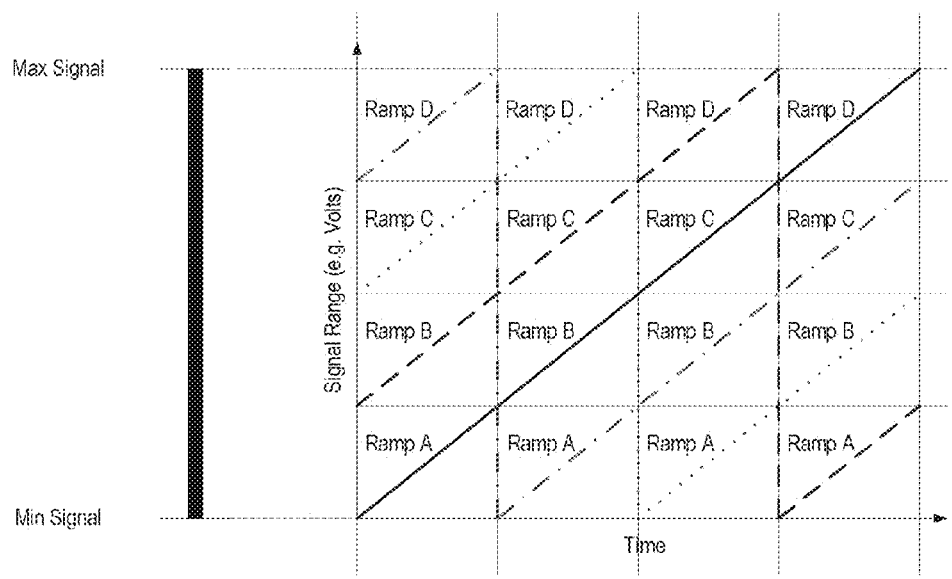
FIG. 9b shows how the four ramp signals of FIG. 9a can be used to produce Ramp A, B, C and D, for a sub-ranging analog-to-digital converter system such as those shown in FIGS. 8 and 11, each covering a quarter of the signal range.

FIG. 9a shows the four ramps for the basic time-interleaved system, each out of phase from one another by 90-deg. FIG. 9b shows how these ramps can be used to produce Ramp A, B, C and D, for sub-ranging system where they each cover a quarter of the signal range. It can be seen that it is possible to obtain (without change in hardware) the necessary four in-phase ramps, each covering a quarter full range whereupon they restart, in addition to the four ramps, out of phase by 90-degress from one another, each covering the signal full range.

Sub-ranging by Selection

Figure 10:
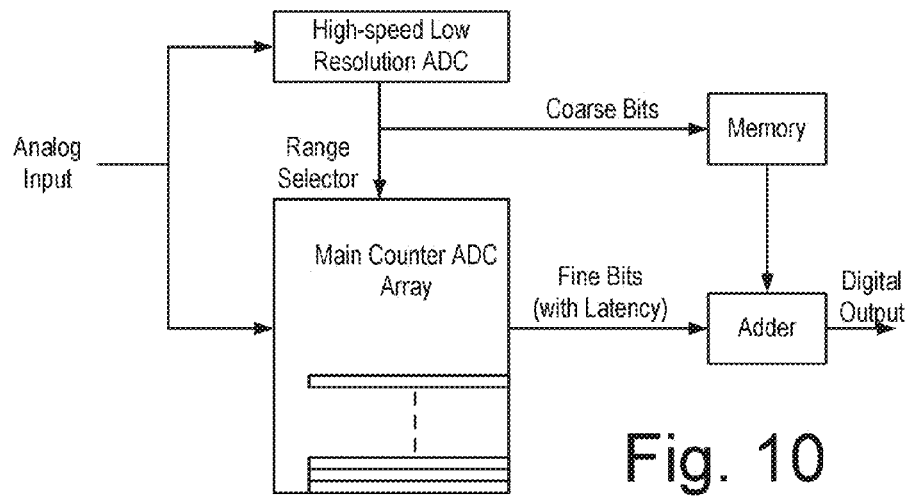
FIG. 10 is a top-level block diagram of a system according to an embodiment of the invention.
Figure 11:
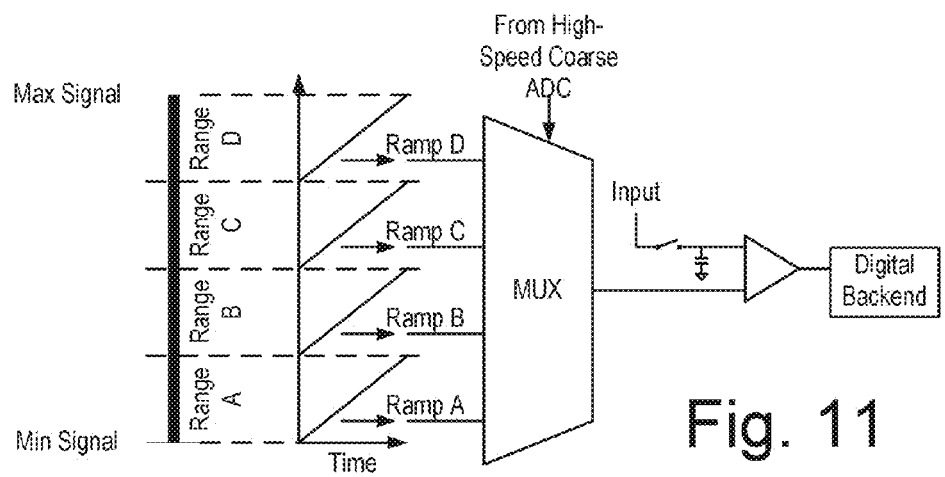
FIGS. 11, 12 13 are circuit diagrams of sections of an analog-to-digital converter featuring sub-ranging of the ramp signal according to alternative embodiments of the invention.

Referring back to FIG. 7b, if there was a way of knowing which sub-range the input signal was in, one could apply the correct ramp to the comparator. In a sub-ranging system by selection, a coarse ADC is used in parallel to the main bank of counter ADCs. FIG. 10 shows a block diagram of such a system. The analog input is fed to the main counter based ADC array as before, but in addition, this analog input is also fed to a high-speed very low-resolution ADC. For the example in FIG. 7b, this would be a 2-bit ADC. Each row of the counter ADC receives four ramps, one for each sub-range of the input signal. This is shown in FIG. 11. The high-speed ADC in parallel informs each row which ramp it should use. This information is also stored in memory, since it represents the 2 coarse (MSB) bits from the output. Once the counter ADC identifies the value of the input signal within this sub-range the digital output is added to the appropriate data from memory to produce the digital output.

Sub-ranging by Subtraction/Addition

Referring back to FIG. 7b, if there was a way of knowing which sub-range (Range) the input signal was in, one could subtract a fixed number of range sizes from the input signal, so the signal always lands in Range-A prior to conversion or, alternatively, a fixed amount of range sizes could be added to Ramp A, so it is always covers the input signal. The top-level block diagram of the system is the same as FIG. 10; however, the two subtraction/addition approaches (applied to input and applied to ramp) are shown in FIG. 12 and FIG. 13.

Figure 12:
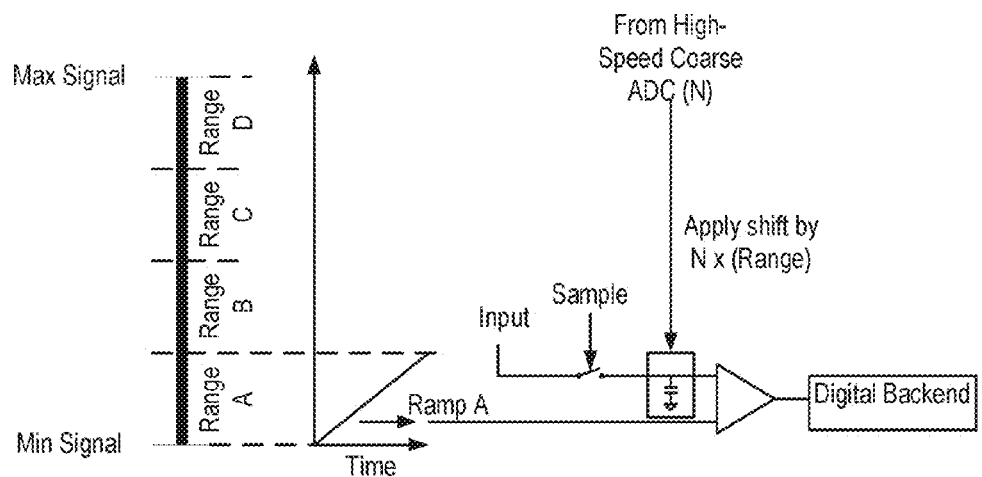

In FIG. 12, the input signal is first sampled onto a capacitor and is then shifted by an amount based on the information from the high-speed ADC. The amount by which the input signal is shifted is equal to the code from the high-speed ADC times the size of a sub-range. Due to this shift, the input will fall inside Range A, and Ramp A can then be used to perform the conversion. This shifting can be done in a number of ways, for example by "moving the bottom plate" of the capacitor by a fixed amount (that is changing the signal level on this bottom plate).

Figure 13:
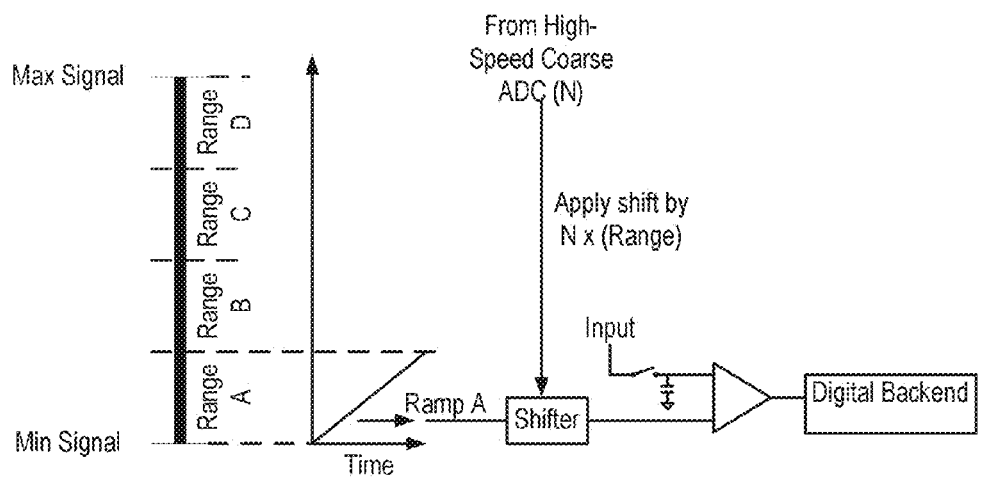

In FIG. 13, the signal is sampled as before, but the ramp is then "moved down" a fixed amount, equal to the high-speed ADC code times the range size. This shifting can also be done for example with a pre-charged capacitor in series.

It will be appreciated that this Subtraction/Addition sub-ranging embodiment only requires one ramp per row compared to the selection sub-ranging embodiment. However, the subtraction/addition needs to be performed with great accuracy, in the order of the accuracy of the overall converter, which may present a difficulty, in practice.

Figure 14:
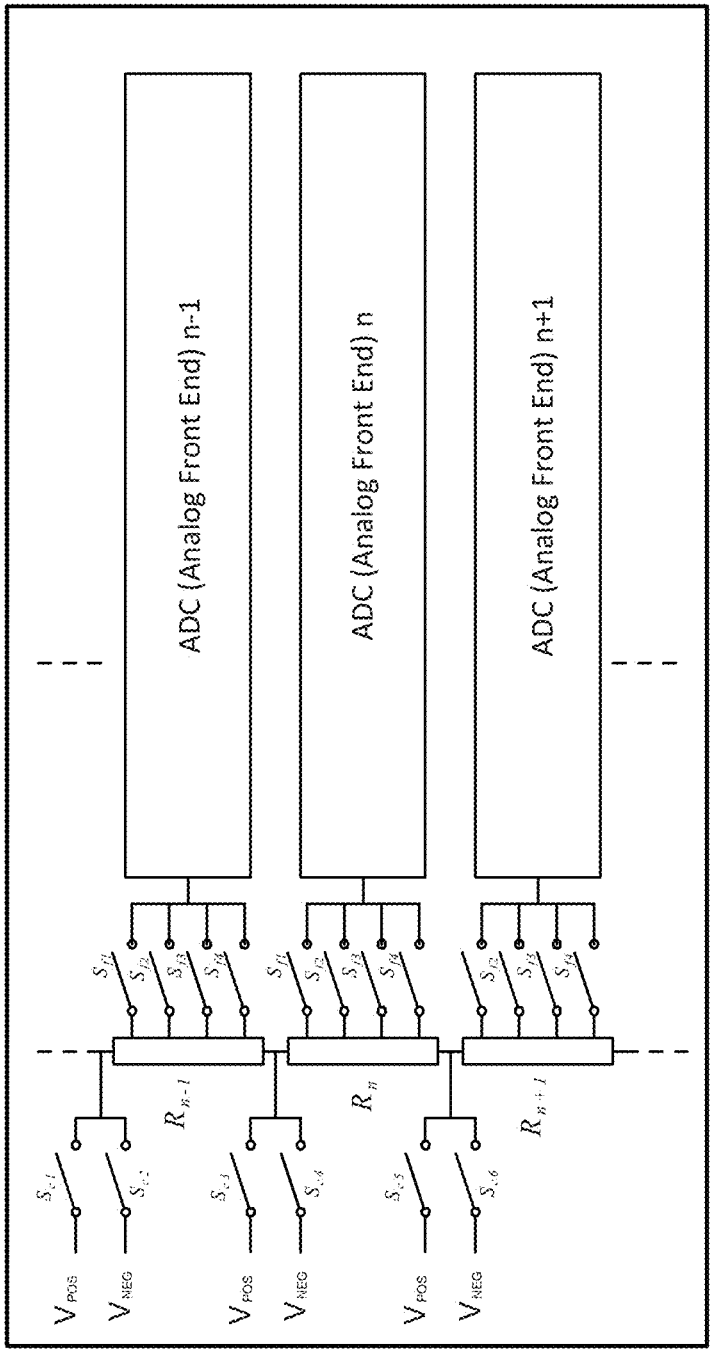
FIG. 14 is a block diagram of a system according to another embodiment of the present invention.

FIG. 14 is a block diagram of a system according to another embodiment of the present invention. With the prior embodiments, the proposed architecture requires the number of rows of the ADC (corresponding to the number of single slope ADCs) to be similar (or in a similar order of magnitude) to the number of unit resistors in the rotary resistor ladder, and close to the overall resolution step, for the architecture to be practically implementable. For example, if 128 rows were to be implemented, then 128 unique ramp signals would be required. To realize such signal generation, a 128 unit resistor is formed in the ring configuration. If the system were operated with a 7-bit resolution, for example, each ramp would have 128 unique voltage levels (since the resistor ladder is 128-elements). If an 8-bit system (when only 128 ADC rows are implemented) 256 unit resistors may be used, only bringing out every second resistor, or implementing 128 unit resistors, but using an interpolating filter to smooth the ramp to 8-bit performance. Both these options have been described above.

Considering an 8 row ADC embodiment of the present, where this number of ADC rows have been chosen for implementation efficiency for the ADC, and an 8-bit system is desirable, 256 unique levels would be supported. Hence, either a 256 element resistor ring would be used, or a large interpolation filter would be used. The first option (the 256-element ring) is impractical to realize in layout, requires very high rotating operation from the ring, and power and area overhead of the required extra switches can significantly limit the performance. Interpolating from an 8 unit resistor ring to effectively an 8-bit system requires a large filtering element and results in a large loss in the ramp full range.

Thus, during design, a correlation between the number of ADC rows, the number of unit resistors in the ramp-generator, and effective resolution exists, and limits the trade-offs in design, especially in thinner geometries. Ideally, these three design tradeoffs should be broken to realize a more efficient ADC.

Therefore, according to another aspect of the present invention, the ramp-generator includes a progression of more unique levels and a smaller number of timing circuits. Looking at the ramp-generator as part of the system, moving to smaller geometries will make the ramp-generator the bottleneck of the system, and potentially a slight change in architecture would be needed. According to this aspect of the present invention, a segmentation in the ramp-generator is employed, where the main ramp generator performs a coarse rotation, and fine rotation is performed locally. This allows more unique resolution steps in the output ramps, while limiting the global number of switches, timing circuits, and variable output resistance.

FIG. 14 illustrates the proposed system, which works particularly well when there is a lower number of ADC rows, compared to unique quantization levels, which will be the case as one moves to thinner geometries. With this embodiment, a set of coarse switches operates similarly to these described above but connects different parts of the main resistor ring to either $V_{POS}$ or $V_{NEG}$, performing the rotating of the main resistor ladder. Then, a number of fine-switches are employed locally to connect an ADC row to different subsections of one unit resistor. Crucially, when stepping through the fine switches one by one, the main resistor ring is no longer rotating, but, in effect, a particular row ADC is walking down the resistor ring. Implementing this for the full ring is practically impossible due to layout limitation since each ADC row would require to be able to connect to every point of the resister ring, while in a segmented system here it only requires connection to parts of the resistor ring, which is local to that row, hence not introducing any layout limitations.

The terms "circuit" and "circuitry" as used herein may refer to an independent circuit or to a portion of a multifunctional circuit that performs multiple underlying functions. For example, depending on the embodiment, processing circuitry may be implemented as a single chip processor or as a plurality of processing chips. Likewise, a first circuit and a second circuit may be combined in one embodiment into a single circuit or, in another embodiment, operate independently perhaps in separate chips. The term "chip," as used herein, refers to an integrated circuit. Circuits and circuitry may include general or specific purpose hardware, or may include such hardware and associated software such as firmware or object code.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" and/or includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to." As may even further be used herein, the term "operable to" indicates that an item includes one or more of power connections, input(s), output (s), etc., to perform one or more its corresponding functions and may further include inferred coupling to one or more other items. As may still further be used herein, the term "associated with," includes direct and/or indirect coupling of separate items and/or one item being embedded within another item. As may be used herein, the term "compares favorably," indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

The invention claimed is:

1. An analog-to-digital converter (ADC) comprising:
a plurality of single slope ADCs, each comprising:
an analog input operable to receive an analog input signal;
a ramp input operable to receive an analog ramp signal of a plurality of analog ramp signals; and
a comparator operable to compare the analog input signal to the analog ramp signal; and
an output operable to produce a digital representation of the analog input signal based upon the comparison, wherein the plurality of single slope ADCs are operable to receive analog ramp signals that are out of phase with one other;
a ramp generator that is operable to generate analog ramp signals for the plurality of single slope ADCs, the ramp generator comprising circuitry to simultaneously generate the plurality of analog ramp signals such that successive ramps signals of the plurality of analog ramp signals are out of phase with one another based upon a clock signal; and
digital output circuitry operable to receive outputs from the plurality of single slope ADCs and to produce a digital representation of the analog input signal based thereupon.

2. The ADC of claim 1, wherein the plurality of single slope ADCs are operable to receive a succession of time corresponding analog ramp signals that are spaced apart temporally, the time corresponding analog ramp signals received at successive single slope ADCs in a cyclic fashion, such the single slope ADCs provides a digital representation of the analog input signal input using the time corresponding analog ramp signals.

3. The ADC of claim 2, wherein of the plurality of single slope ADCs are operable to receive the analog input signal over time in a cyclic fashion.

4. The ADC of claim 1, wherein:
the plurality of single slope ADCs comprise four single slope ADCs; and
the four single slope ADCs are operable such that at any time of operation:
a first single slope ADC is in a reset mode;
a second single slope ADC is receiving the analog input signal;
a third single slope ADC is converting the analog input signal to a corresponding digital representation; and
a fourth single slope ADC is conveying a digital representation of yet another of one of the analog input signals.

5. The ADC of claim 1, wherein the ramp generator comprises:
a first circuit for generating a plurality of first analog ramp signals; and
a plurality of second circuits, the plurality of second circuits respective to the plurality of single slope ADCs and operable to produce the plurality of analog ramp signals based upon the plurality of first analog ramp signals.

6. The ADC of claim 5, wherein the first circuit of the ramp generator is operable to produce a plurality of first analog ramp signals that are all out of phase with one another, and such that successive first analog ramp signals are out of phase by a single clock period.

7. The ADC of claim 5, wherein:
the first analog ramp signals comprise coarse ramp signals; and
the second analog ramp signals comprise fine ramp signals.

8. The ADC of claim 1, wherein the ramp generator comprises:
a plurality of resistive elements arranged in series so as to form a ring;
a switch network;
first and second power supplies, producing outputs at different levels; and
a controller arranged to control the switch network so as to connect a first power supply successively to nodes of the resistor ring while also connecting a second power supply to a node diametrically opposite the node to which the first power supply is connected, such that the first and second supplies are always connected to diametrically opposed nodes and such that first and second power supply connections effectively rotate around the ring during ramp generation, thereby providing a plurality of ramp outputs, from different nodes of the resistor ring.

9. The ADC of claim 8, wherein the resistor ring is comprised of four times as many resistors as ramp outputs, the ramp outputs being taken from two diametrically opposed nodes multiplexed together.

10. The ADC of claim 8, wherein the ramp generator comprises two switches for some of the nodes, so as to enable selective connection of the nodes to the power supplies.

11. The ADC of claim 1, wherein single slope ADCs comprises sample and hold circuits that are operative to sample the analog input signal and to maintain a voltage of the sampled analog input signal during conversion to a corresponding digital representation.

12. The ADC of claim 11, wherein the sample and hold circuits comprise single pole single throw switches in series with capacitors, the switches being operative to couple the analog input signals to the capacitors for storage thereon.

13. The ADC of claim 1, wherein the single slope ADCs comprise comparators that are operative to receive an analog input signal at a first input and an analog ramp signal at a second input.

14. The ADC of claim 1, wherein the single slope ADCs comprise a differential sample and hold circuit configured to sample one end of a differential input signal onto a first input of a comparator, and the other end of the differential input signal onto a second input of the comparator and then to apply two ramp signals of opposite slope such that one is applied to each input, the comparator output being operable to flip when its inputs reach a common level, the time taken to do so being determined by the differential input signal.

15. The ADC of claim 1, further comprising a digital counter, wherein the plurality of single slope ADCs comprises a digital memory coupled to the digital counter such that the digital counter is operative to cycle continuously and the ADCs are configured to convey a value from the digital counter to the digital memories, the ADC being further operable to read a final value from each digital memory, the final value being dependent upon the analog input signal of the corresponding single slope ADC.

16. The ADC of claim 15, wherein the ADC is operable to convert values conveyed from the digital counter to a coded value according to a code in which two successive values differ in respect of only one bit, such as Gray code.

17. The ADC of claim 1, wherein the analog ramp signals received by at least some of the single slope ADCs covers only a sub-range within the total possible range of the ADC.

18. The ADC of claim 1, wherein the analog ramp signals received by each of the single slope ADCs covers only a sub-range within the total possible range of the ADC.

19. The ADC of claim 18, wherein a number of the single slope ADCs operate in parallel to convert a single analog input signal, the number of single slope ADCS being operable to receive an analog ramp signal that covers only a sub-range within the total possible range of the analog input signal, the sub-ranges together covering the total possible range.

20. A method of analog-to-digital conversion comprising:
receiving an analog input signal and respective analog ramp signals at a plurality of single slope analog-to-digital converters (ADCs), such that successive ramps signals are out of phase with one another based upon a clock signal; and
operating the plurality of single slope ADCs to provide digital representations of the analog input signal in dependence on the analog input signal and the respective analog ramp signals; and
combining the digital representations produced by the plurality of single slope ADCs to produce a composite output.

21. The method of claim 20 further comprising receiving a succession of analog input signals and a succession of time corresponding analog ramp signals, the analog input signals and time corresponding analog ramp signals being spaced apart temporally, the analog input signals and corresponding analog ramp signal being received at successive single slope ADCs in a cyclic fashion, such that the single slope ADCs provide a digital representation of the analog input signal input thereto using the time corresponding analog ramp signal.

22. The method of claim 21, wherein, at any one time, a first single slope ADC is in a reset mode, a second single slope ADC is receiving one of the analog input signal, a third single slope ADC is converting another of the analog input signal to a corresponding digital representation and a fourth single slope ADC is conveying a digital representation of yet another of the analog input signals.

23. The method of claim 22, further comprising generating analog ramp signals for the plurality of single slope ADCs using a single ramp generator, such that the plurality of ramp signals are all out of phase with one other, and such that successive ramps signals are out of phase by a single clock period.

* * * * *

UNITED STATES PATENT AND TRADEMARK OFFICE
CERTIFICATE OF CORRECTION

PATENT NO. : 8,552,901 B2
APPLICATION NO. : 13/214788
DATED : October 8, 2013
INVENTOR(S) : Seyed A A Danesh et al.

It is certified that error appears in the above-identified patent and that said Letters Patent is hereby corrected as shown below:

In the Claims

Col. 13, line 39, in claim 1: replace "one other" with --one another--
Col. 14, lines 49-50, in claim 11: replace "comprises" with --comprise--
Col. 15, line 24, in claim 19: after "single slope" replace "ADCS" with --ADCs--
Col. 16, line 30, in claim 23: replace "one other" with --one another--

Signed and Sealed this
First Day of July, 2014

Michelle K. Lee
*Deputy Director of the United States Patent and Trademark Office*